US010026591B2

(12) United States Patent
Kodaira et al.

(10) Patent No.: US 10,026,591 B2
(45) Date of Patent: Jul. 17, 2018

(54) METHOD FOR MANUFACTURING SEMICONDUCTOR DEVICE, ION BEAM ETCHING DEVICE, AND CONTROL DEVICE

(71) Applicant: CANON ANELVA CORPORATION, Asao-ku, Kawasaki-shi, Kanagawa (JP)

(72) Inventors: Yoshimitsu Kodaira, Kawasaki (JP); Yukito Nakagawa, Kawasaki (JP); Motozo Kurita, Kawasaki (JP)

(73) Assignee: Canon Anelva Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 15/648,584

(22) Filed: Jul. 13, 2017

(65) Prior Publication Data

US 2017/0316918 A1    Nov. 2, 2017

Related U.S. Application Data

(63) Continuation of application No. 14/440,110, filed as application No. PCT/JP2013/073597 on Sep. 3, 2013, now Pat. No. 9,734,989.

(30) Foreign Application Priority Data

Nov. 2, 2012 (JP) ................................ 2012-242602
Dec. 5, 2012 (JP) ................................ 2012-266577

(51) Int. Cl.
*H01L 21/302* (2006.01)
*H01L 21/461* (2006.01)
(Continued)

(52) U.S. Cl.
CPC ........ *H01J 37/321* (2013.01); *H01J 37/3244* (2013.01); *H01J 37/3266* (2013.01);
(Continued)

(58) Field of Classification Search
USPC .............................. 216/67; 438/712; 118/715
See application file for complete search history.

(56) References Cited

U.S. PATENT DOCUMENTS

2004/0244687 A1    12/2004  Ichiki et al.
2007/0068624 A1    3/2007   Jeon et al.
(Continued)

FOREIGN PATENT DOCUMENTS

CN    102263012 A    11/2011
CN    102290346 A    12/2011
(Continued)

OTHER PUBLICATIONS

International Search Report (PCT/ISA/210) dated Nov. 5, 2013, by the Japanese Patent Office as the International Searching Authority for International Application No. PCT/JP2013/073597.
(Continued)

*Primary Examiner* — Roberts Culbert
(74) *Attorney, Agent, or Firm* — Buchanan Ingersoll & Rooney PC

(57) ABSTRACT

An ion beam etching device includes a grid provided between a treatment chamber and a plasma generation chamber, and for forming an ion beam by drawing ions from the plasma generation chamber; a gas introduction unit for introducing discharge gas into the plasma generation chamber; an exhaust for exhausting the treatment chamber; a substrate holder; a control unit to receive a measurement result of an in-plane film thickness distribution before the substrate is processed; and an electromagnetic coil provided outside of the plasma generation chamber in a ceiling portion opposite to the grid of the plasma generation chamber. The electromagnetic coil includes an outer coil provided on an outer circumference of the ceiling portion and an inner coil provided on an inner circumference of the ceiling portion, and the control unit controls the currents applied to
(Continued)

the outer coil and the inner coil in accordance with the measurement result.

3 Claims, 9 Drawing Sheets

(51) Int. Cl.

| | |
|---|---|
| *H01J 37/32* | (2006.01) |
| *H01L 21/66* | (2006.01) |
| *H01L 21/321* | (2006.01) |
| *H01L 21/311* | (2006.01) |
| *H01L 21/3105* | (2006.01) |
| *H01L 29/78* | (2006.01) |
| *H01L 29/66* | (2006.01) |
| *H01L 21/3213* | (2006.01) |

(52) U.S. Cl.
CPC .. *H01J 37/32339* (2013.01); *H01J 37/32422* (2013.01); *H01J 37/32715* (2013.01); *H01L 21/31055* (2013.01); *H01L 21/31116* (2013.01); *H01L 21/31144* (2013.01); *H01L 21/3212* (2013.01); *H01L 21/32136* (2013.01); *H01L 22/12* (2013.01); *H01L 22/20* (2013.01); *H01L 29/6656* (2013.01); *H01L 29/66545* (2013.01); *H01L 29/7833* (2013.01); *H01J 2237/334* (2013.01)

(56) References Cited

U.S. PATENT DOCUMENTS

| | | |
|---|---|---|
| 2011/0309050 A1 | 12/2011 | Iori et al. |
| 2011/0309451 A1 | 12/2011 | Tsukamoto |
| 2011/0312180 A1 | 12/2011 | Wang |
| 2012/0012889 A1 | 1/2012 | Okabe et al. |
| 2012/0298303 A1 | 11/2012 | Ikeda et al. |

FOREIGN PATENT DOCUMENTS

| | | |
|---|---|---|
| JP | 8-129982 A | 5/1996 |
| JP | H09-82490 | 3/1997 |
| JP | 2002216653 | 8/2002 |
| JP | 2002-359213 A | 12/2002 |
| JP | 2003514389 | 4/2003 |
| JP | 2005-116865 A | 4/2005 |
| JP | 2007-096299 | 4/2007 |
| JP | 2011-246761 A | 12/2011 |
| JP | 2012-4455 A | 1/2012 |
| TW | 200300579 A | 6/2004 |
| TW | 201208001 A | 2/2012 |
| WO | WO 2010/090127 A1 | 8/2010 |
| WO | WO 2012/073449 A1 | 6/2012 |

OTHER PUBLICATIONS

Office action in Taiwan dated Mar. 23, 2015 for SN 102139547.
International Preliminary Report on Patentability (PCT/IB/373) dated May 5, 2015, by the Japanese Patent Office as the International Searching Authority, for International Application No. PCT/JP2013/073597.
English Translation of the Taiwanese Office Action for Application No. 102139547, dated Jun. 8, 2015.
Office Action issued in corresponding Korean Patent Application No. 10-2016-7025795; dated Nov. 7, 2016, with English translation (10 pages).
An Office Action (Notice of Preliminary Rejection), dated Apr. 8, 2016 by the Korean Intellectual Property Office in corresponding Korean Patent Application No. 10-2015-7008472, and an English Translation of the Office Action (9 pages).
Office Action issued in corresponding Japanese Patent Application No. 2017-085770, dated Mar. 20, 2018. (6 pages).

METHOD FOR MANUFACTURING SEMICONDUCTOR DEVICE, ION BEAM ETCHING DEVICE, AND CONTROL DEVICE

CROSS-REFERENCE TO RELATED APPLICATIONS

The present application is a continuation of Ser. No. 14/440,110, which is a national stage application of PCT/JP2013/073597, which was filed on Sep. 3, 2013, and which claims the priority of JP 2012-242602, which was filed on Nov. 2, 2012, and JP 2012-266577, which was filed on Dec. 5, 2012. The entirety of U.S. Ser. No. 14/440,110; PCT/JP2013/073597; JP 2012-242602; and JP 2012-266577 are incorporated herein by reference.

TECHNICAL FIELD

The present invention relates a method for manufacturing a semiconductor device, and an ion beam etching device and a control device used for the method.

BACKGROUND ART

A metal-insulator (oxide)-semiconductor field effect transistor (MISFET or MOSFET) is a basic element of a semiconductor device. A complementary metal-oxide-semiconductor (CMOS) circuit to which the MOSFET is applied consumes less electricity, can easily achieve miniaturization and high integration, and can operate at a high speed, and therefore, the CMOS circuit is widely used as a device for constituting many LSIs.

In the past, a thermally-oxidized silicon ($SiO_2$) film or a film obtained by nitriding oxidized silicon in heat or plasma (SiON) has been widely used for a gate insulating film of a MOSFET. An n-type polysilicon layer doped with phosphorus (P) or arsenic (As) and a p-type polysilicon layer doped with boron (B) have been widely used as a gate electrode.

However, according to the scaling law, when the gate insulating film is thinned, or the gate length is reduced, the gate leak current increases or the reliability decreases due to thinner film thickness of the $SiO_2$ film or the SiON film. Since, e.g., the gate capacitance may decrease due to a depletion layer formed in the gate electrode, a method using an insulating material (high dielectric film) having a high dielectric constant for the gate insulating film and a method using a metal material for the gate electrode have been suggested.

Examples of high dielectric film materials include hafnium-based compounds and the like, and among them, hafnium oxide ($HfO_2$) is a desired material since hafnium oxide can suppress degradation of the electron mobility and the hall mobility while it has a high dielectric constant. However, there is a problem in that characteristics degradation such as carrier mobility degradation may occur when high temperature treatment step such as activation annealing treatment of the source and the drain is performed.

Therefore, as compared with a conventional manufacturing method in which the high temperature treatment step of the source and the drain is applied after the gate insulating film and the gate electrode are formed, a manufacturing method in which the gate insulating film and the gate electrode are formed after the high temperature treatment is applied has been suggested. In this case, a transistor configuration formed according to the former manufacturing method will be referred to as a gate first structure, and a transistor configuration formed according to the latter manufacturing method will be referred to as a gate last structure.

For example, Patent Literature 1 discloses a CMOS circuit in which an n-channel MOSFET has a gate first structure, and a p-channel MOSFET has a gate last structure. In the CMOS circuit, first, both of the n-channel MOSFET and the p-channel MOSFET are formed in the gate first structure, and thereafter, the gate electrode is removed only in the p-channel MOSFET, and a new conductive layer is deposited to form a MOSFET having the gate last structure. In such process, by selecting a gate electrode material for each of them, a gate electrode having a work function (WF) appropriate for each of the n-channel MOSFET and the p-channel MOSFET can be formed.

When the gate electrode of the p-channel MOSFET having the gate last structure in the CMOS circuit disclosed in Patent Literature 1 is formed, first, a stopper film for chemical mechanical planarization (CMP) is formed, the gate electrode of the p-channel MOSFET having the gate first structure formed previously and the CMP stopper film on the gate electrode are removed, so that an opening portion is formed, and titanium nitride and aluminum are filled in the opening portion. Thereafter, excessive titanium nitride and aluminum film is polished and removed up to the CMP stopper film by the CMP step.

In the CMOS circuit of Patent Literature 1, a silicon nitride film (stress liner film) having pulling stress or compression stress is formed on the source and the drain, so that the stress of the channel region of the transistor is modulated, and the mobility of carriers is improved.

Patent Literature 2 discloses a method for planarizing a hard substrate surface such as SiC with CMP treatment, and thereafter, argon gas cluster emission and nitrogen gas cluster emission are applied to a substrate surface, thus removing polishing scratches made in the CMP treatment and planarizing the substrate surface.

PRIOR ART REFERENCE

Patent Literature

Patent Literature 1: Japanese Paten Application Laid-Open No. 2012-4455
Patent Literature 2: Japanese Paten Application Laid-Open No. 2011-246761

SUMMARY OF THE INVENTION

Problem to be Solved by the Invention

In the CMP step in the invention disclosed in Patent Literature 1, the amount difference of polishing in the plane of the substrate is likely generated. In general, in a central portion in the substrate plane, the amount of polishing is small, and in an outer peripheral portion in the substrate plane, the amount of polishing is large. More specifically, the film thickness in the substrate plane after polishing tends to become thick in the center and tends to become thin in the periphery. Such difference in the amount of polishing in the CMP step degrades the manufacturing yield of semiconductor device.

In the invention disclosed in Patent Literature 2, minute polishing flaw in the substrate plane generated in the CMP treatment are planarized by the gas cluster ion beam etching, but this method cannot solve the difference in the amount of polishing between the central portion and the peripheral portion in the substrate caused by the CMP treatment.

The present invention is made to solve the above problem, and it is an object of the present invention to provide uniform semiconductor devices within a substrate plane by easily correcting a film thickness distribution within a substrate plane generated by CMP in a process of manufacturing semiconductor devices.

Means for Solving the Problem

In order to solve the above problem, the present disclosure is a method for manufacturing a semiconductor device including a CMP step of polishing a substrate with chemical mechanical polishing, and an IBE step of performing ion beam etching treatment to the polished substrate, wherein in the ion beam etching treatment in the IBE step, etching rates in a central portion and an outer peripheral portion in the substrate plane are different.

Further, the present disclosure is an ion beam etching device including a plasma generation chamber, a treatment chamber configured to process a substrate, a grid provided between the treatment chamber and the plasma generation chamber, and for forming ion beam by drawing ion from the plasma generation chamber, a gas introduction unit for introducing discharge gas into the plasma generation chamber, an exhaust means for exhausting the treatment chamber, and a substrate holder in which a substrate provided in the treatment chamber is placed, wherein an aperture ratio of ion passage holes of the grid is different between a position facing a central portion in the substrate plane and a position facing an outer peripheral portion in the substrate plane.

Further, the present disclosure is a control device used for an ion beam etching device, wherein a measurement result of an in-plane film thickness distribution of a substrate is input, and each of electric current values of an outer coil provided outside of a plasma generation chamber and on an outer circumference of a ceiling portion opposite to a grid of the plasma generation chamber and an inner coil provided on an inner circumference of the ceiling portion is controlled on the basis of the measurement result.

Effects of the Invention

According to the present disclosure, the ion beam etching treatment is performed with a distribution provided in the etching rate after the CMP step, so that the film thickness distribution in the substrate plane generated by the CMP can be corrected easily. Therefore, according to the present disclosure, semiconductor devices that are uniform in the substrate plane can be manufactured, and the manufacturing yield of the semiconductor devices can be improved.

MODE FOR CARRYING OUT THE INVENTION

Figure 1:
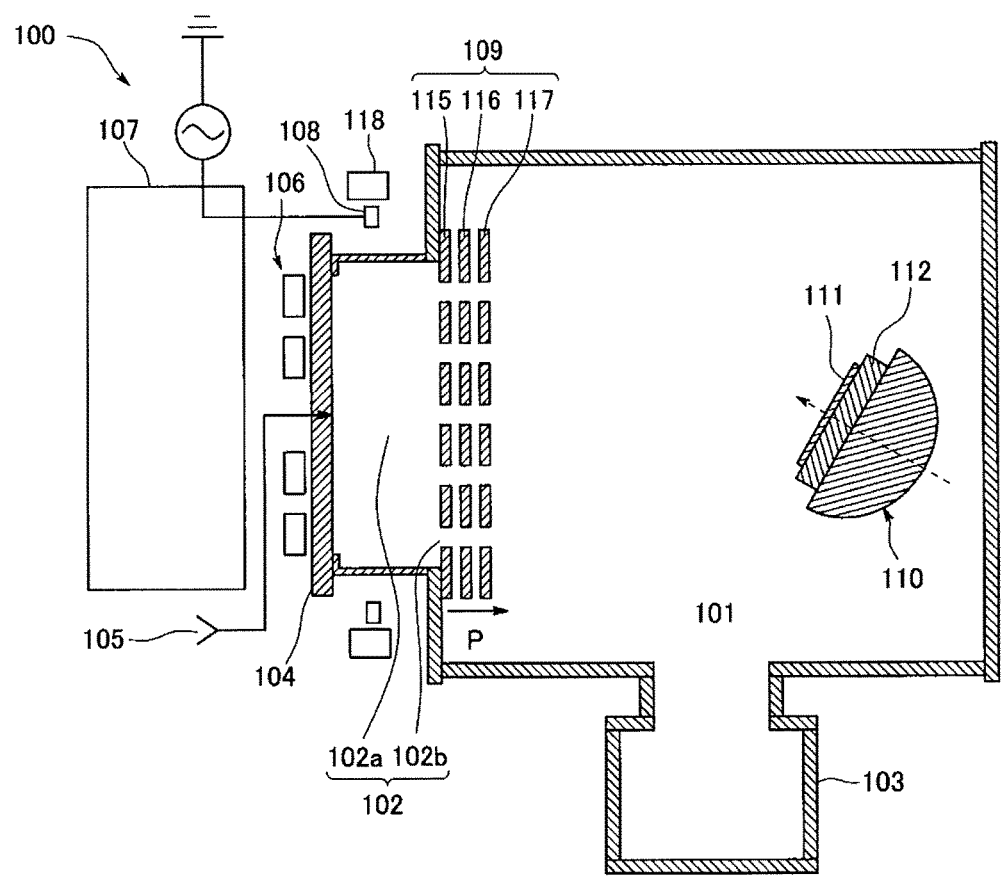
FIG. 1 is a cross sectional view schematically illustrating a configuration of an ion beam etching device according to the present disclosure.

Although embodiments of the present invention will be hereinafter explained with reference to drawings, the present invention is not limited the present embodiments. In the drawings explained below, those having the same functions are denoted with the same reference numerals, and repeated explanation thereabout may be omitted.

First Embodiment

FIG. 1 illustrates a schematic view of an ion beam etching (IBE) device according to the present embodiment. The IBE device includes a treatment chamber 101 and an ion beam generation device 100 provided to emit an ion beam into the treatment chamber 101. The ion beam generation device 100 and the treatment chamber 101 are connected, and the ion beam generated by the ion beam generation device 100 is introduced into the treatment chamber 101.

In the treatment chamber 101, a substrate holder 110 capable of holding a substrate 111 is provided so that the ion beam emitted from the ion beam generation device 100 is incident thereupon, and the substrate 111 is placed on an electrostatic chuck (ESC) electrode 112. In the treatment chamber 101, an exhaust means 103 is installed. In the treatment chamber 101, a neutralizer (not shown) is provided, and the neutralizer can electrically neutralize the ion beam introduced from the ion beam generation device 100. Therefore, the electrically neutralized ion beam can be emitted to the substrate 111, and this prevents the substrate 111 from being charged up. The substrate holder 110 can incline to any angle with respect to the ion beam. The substrate holder 110 is in such a structure that the substrate 111 can be rotated (revolved) in the in-plane direction thereof.

The ion beam generation device 100 includes a plasma generation chamber 102. The plasma generation chamber 102 serving as a discharge chamber includes a bell jar 104 serving as a member having a hollow portion and an opening, and an internal space 102a, i.e., the hollow portion, is a discharge space where plasma discharge is generated. In the present embodiment, as shown in FIG. 1, the bell jar 104 made of, for example, quartz is attached to the treatment chamber 101 made of, for example, stainless, so that the treatment chamber 101 and the plasma generation chamber 102 are connected. More specifically, a bell jar 104 is provided with the treatment chamber 101 so that the opening formed in the treatment chamber 101 and the opening of the bell jar 104 (the opening 102b of the plasma generation chamber 102) overlap each other.

The internal space 102a is in communication via the opening 102b with the outside, and the ion generated in the internal space 102a is drawn from the opening 102b. In the plasma generation chamber 102, a gas introduction unit 105 is provided, and the gas introduction unit 105 introduces etching gas into the internal space in the plasma generation chamber 102. An RF antenna 108 connected to a matching device 107 and generating a radio frequency (RF) field is disposed around the plasma generation chamber 102 so as to generate the plasma discharge in the internal space. At a ceiling portion of the bell jar 104 (at the side opposite to a grid 109), an electromagnetic coil 106 is provided. In such configuration, discharge gas is introduced from the gas introduction unit 105, and a radio frequency is applied to the RF antenna 108, so that the plasma of the discharge gas can be generated in the plasma generation chamber 102. A permanent magnet 118 is further provided at the outer periphery of the RF antenna 108.

In the present embodiment, as shown in FIG. 1, the treatment chamber 101 and the plasma generation chamber 102 are connected, but the ion beam generation device 100 is further provided with the grid 109 provided at the border between the treatment chamber 101 and the plasma generation chamber 102 and serving as a drawing means for drawing ions from the plasma generated in the internal space 102a. In the present embodiment, a direct current voltage is applied to the grid 109, and the ions in the plasma generation chamber 102 are drawn as the beam, and the drawn ion beam is emitted onto the substrate 111, so that the substrate 111 is processed. It should be noted that the grid 109 is attached to the device by a fastening member, not shown, in FIG. 1, and each electrode is connected by a connection unit, not shown.

The grid 109 is provided on the opening 102b formed at the ion discharge side of the plasma generation chamber 102. The grid 109 includes at least three electrodes, and each electrode includes many ion passage holes for passing ions generated in the internal space 102a. At least three electrodes which are constituent elements of the grid 109 are arranged to be away from each other in the opening 102b so that the ions from the internal space 102a are passed through the ion passage holes and are discharged to the outside of the plasma generation chamber 102 toward the outer side of the opening 102b from the internal space 102a, i.e., the propagation direction of the ion beam drawn from the grid 109. More specifically, each of the at least three electrodes is a plate-shaped electrode, and among the at least three electrodes, the electrode closest to the internal space 102a functions as a member for dividing the discharge space of the opening 102b, and the surface of each electrode having ion passage holes formed therein face each other.

In the present disclosure, the grid means an electrode assembly having multiple electrodes, a fixing member fixing and connecting each of the multiple electrodes, insulating materials between the electrodes, and the like.

In the present embodiment, at these two borders which are connection portions of the plasma generation chamber 102 and the treatment chamber 101, the grid 109 includes a first electrode 115 (plasma-side grid), a second electrode 116, and a third electrode 117 (substrate-side grid), which are provided from the side of the plasma generation chamber 102. The first electrode 115, the second electrode 116, and the third electrode 117 are arranged in a direction P extending from the plasma generation chamber 102 to the treatment chamber 101, so that each of the ion passage holes formed in the first electrode 115, each of the ion passage holes formed in the second electrode 116, and each of the ion passage holes formed in the third electrode 117 face each other. In normal cases, the ion passage hole at each point of the first electrode 115 to the third electrode 117 has the same diameter, and the ion passage holes are disposed to overlap each other. The electrodes are connected by the fixing member 120, and are fixed to the processing device.

In the present embodiment, the first electrode 115 and the second electrode 116 are connected to a power supply, not shown, and the potential of each electrode can be controlled. The third electrode 117 is grounded. A power supply may be connected to the third electrode 117, so that the potential is controlled.

The first electrode 115 is disposed at the side closest to the internal space 102a (at the side closest to the plasma generation chamber 102) in the opening 102b of the plasma generation chamber 102, and also functions as a member for dividing the internal space 102a in the opening 102b. The second electrode 116 is disposed at the outer side of the internal space 102a with respect to the first electrode 115 (at the side of the treatment chamber 101 with respect to the first electrode 115) along the arrangement direction P from the first electrode 115 to the third electrode 117. The third electrode 117 is an electrode disposed at the outer side of the internal space 102a with respect to the second electrode 116 along the arrangement direction P from the first electrode 115, and is one of electrodes serving as constituent elements of the grid 109 that is disposed at the most outer side of the plasma generation chamber 102 along the arrangement direction P, i.e., an electrode disposed closest to the treatment chamber 101.

Figure 2:
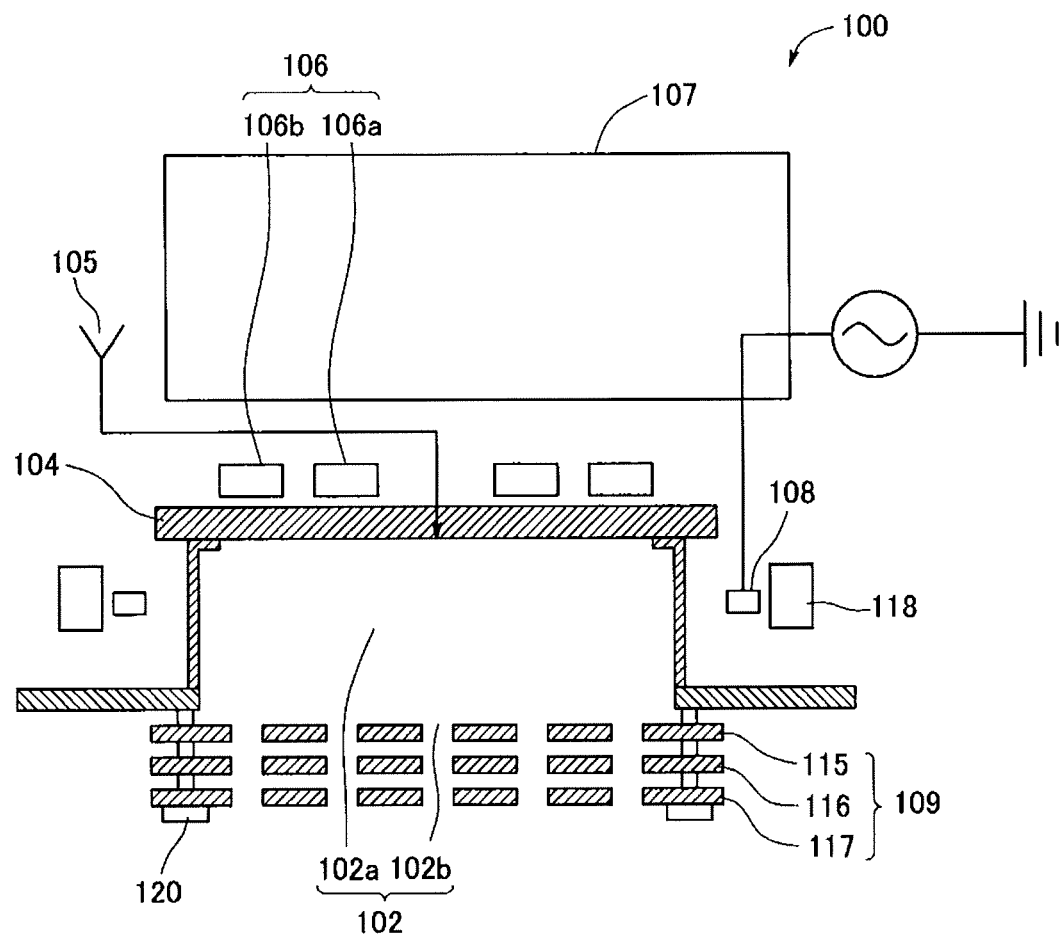
FIG. 2 is a cross sectional view schematically illustrating a configuration in proximity to a plasma generation chamber in the ion beam etching device of FIG. 1.

A vicinity of the plasma generation chamber 102 of the ion beam generation device 100 explained above will be explained in more details with reference to FIG. 2.

The electromagnetic coil 106 disposed outside of the plasma generation chamber 102 and at the ceiling portion of the bell jar 104 includes a ring-shaped inner coil 106a attached to the inner peripheral portion and a ring-shaped outer coil 106b attached to the outer peripheral portion. Each of the inner coil 106a and the outer coil 106b is connected to a power supply, not shown, and is configured such that the current value applied to each coil can be controlled independently from each other. It should be noted that the ceiling portion of the bell jar 104 means a portion opposite to the grid 109 in the bell jar 104 constituting the plasma generation chamber 102.

Figure 3A:
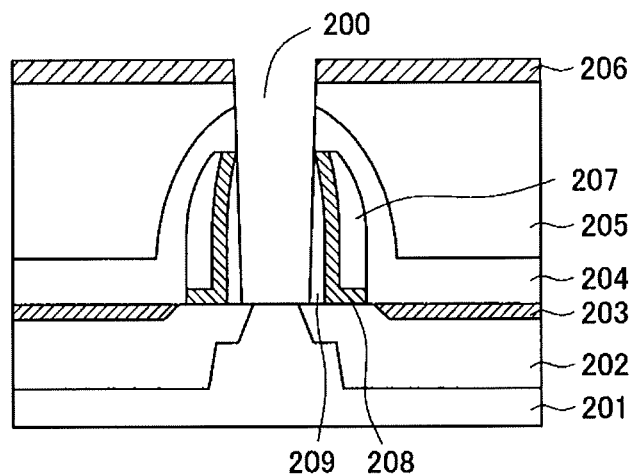
FIGS. 3A to 3C are cross sectional schematic views for explaining a portion of a process of manufacturing a field effect transistor having a gate last structure according to a first embodiment of the present invention.

A process of manufacturing a semiconductor device having a field effect transistor (FET) in a gate last structure will be explained with reference to FIG. 3 as an example of a method for manufacturing a semiconductor device according to the present disclosure. Such process can be applied to, for example, a process of manufacturing a p-channel MOSFET of a CMOS circuit disclosed in Patent Literature 1. In FIG. 3A, reference numeral 201 denotes an n-type well, reference numeral 202 denotes a p-type source and a p-type drain generated by introducing a conductive impurity into a substrate at both end portions of the gate electrode, reference numeral 203 denotes a high melting point metal silicide film made of an NiSi film, reference numeral 204 denotes a stress liner film made of SiN for applying a predetermined stress to the substrate, reference numeral 205 denotes an insulating film made of $SiO_2$ and the like, and reference numeral 206 denotes a CMP stopper film made of SiN. Reference numerals 207, 208, 209 denote side wall insulating films, and reference numeral 207 is made of SiN, reference numeral 208 is made of $SiO_2$, and reference numeral 209 is made of SiN.

Figure 3B:
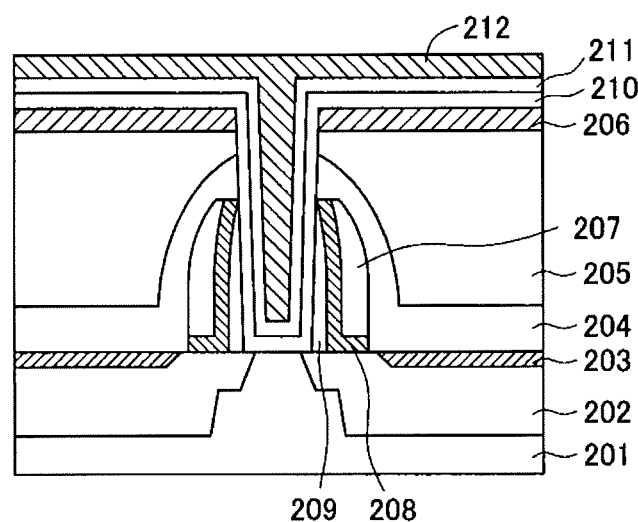

Subsequently, as shown in FIG. 3B, agate insulating film 210 is formed on the inner wall of the trench 200 and the CMP stopper film 206. The gate insulating film 210 is preferably formed by an insulating material of which dielectric constant has a relative permittivity higher than at least 8.0. Subsequently, a diffusion preventing film 211 made of TiN and a conductive film 212 made of aluminum (Al) are formed on the gate insulating film 210. These films are formed by sputtering method and the like. Not only Al but also copper (Cu), tungsten (W), and the like are preferably used as the conductive film 212.

Figure 3C:
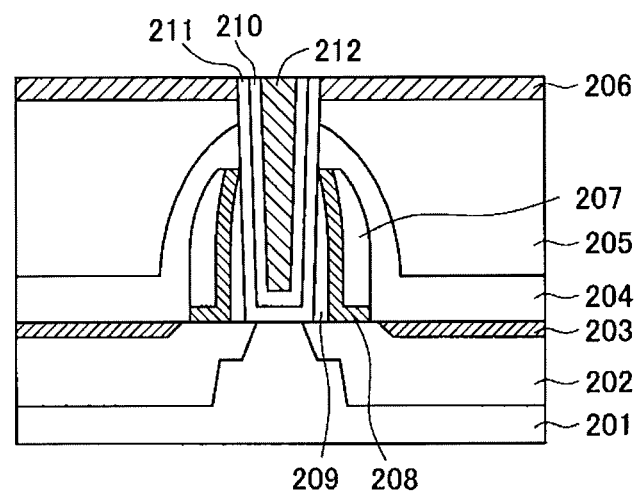

Thereafter, in the conventional case, as shown in FIG. 3C, the conductive film 211, the diffusion preventing film 211, and the gate insulating film 201 formed on the CMP stopper film 206 are removed by the CMP step, and a gate electrode made of the conductive film 212 is formed in the trench.

In this CMP step, in general, the polishing speed is faster in the outer peripheral portion than the central portion of the substrate plane, and after the polishing, the film thickness becomes different between the outer peripheral portion and the central portion of the substrate plane. More specifically, on the CMP stopper film 206, the gate insulating film 210 having a film thickness distribution remains. This is considered to be caused by, e.g., particle sizes of slurry used in the CMP, a pressure application per unit area at each point in the substrate plane, operation of a polishing pad, and the like. The film thickness distribution in this substrate plane affects the gate threshold value voltage (Vt) of the gate electrode, which causes variation in the element characteristics of FETs.

The present disclosure uses an IBE step to correct a film thickness distribution in the substrate plane caused in the CMP step, and more particularly, correct a film thickness distribution in the diameter direction of a substrate, and in the process of manufacturing an FET as shown in FIGS. 3A to 3C, polishing is done until the gate insulating film 210 is exposed in the CMP step or immediately before the gate insulating film 210 is exposed, and thereafter, the gate insulating film 210 is etched in the IBE step. In this IBE step, the etching rate is varied in the direction in the substrate plane, so that the etching is done while correcting the film thickness distribution of the gate insulating film 210, and the film thickness distribution can be solved. In the present disclosure, "the film thickness distribution is corrected" means that the film thickness distribution of the substrate is solved after the IBE step. Therefore, when the film thickness distribution is solved, all the film having the film thickness distribution may not be removed in the IBE step, but all the film having the film thickness distribution may be removed, and as necessary, films including a film of an under layer thereof may be further removed.

Therefore, in the process of manufacturing the FET of FIGS. 3A to 3C, the film thickness distribution of at least the gate insulating film 210 may be solved in the IBE step, and the gate insulating film 210 having a uniform film thickness may be left, or all the gate insulating film 210 may be removed in the IBE step, and further, a portion of or all of the CMP stopper film 206 may be removed.

The IBE device according to the present disclosure includes an outer coil 106b disposed outside of the plasma generation chamber 102 and on the outer periphery of the ceiling portion of the plasma generation chamber 102 opposite to the grid 109, and an inner coil 106a disposed on the inner periphery of the ceiling portion, and can control the current value of each of them independently from each other. By controlling the current value of each of the two coils, the in-plane distribution of the plasma density in the plasma generation chamber 102 can be adjusted. When the plasma density in the plasma generation chamber 102 is varied, the amount of ion beam drawn from the grid 109 is varied according to the plasma density at each point. More specifically, at a point where the plasma density is high, the amount of ion beam drawn increases, and at a point where the plasma density is low, the amount of ion beam drawn decreases.

In the present disclosure, at a position of the plasma generation chamber 102 facing the central portion in the plane of the substrate 111, the plasma density distribution is increased, and at a position of the plasma generation chamber 102 facing the outer peripheral portion in the plane of the substrate 111, the plasma density distribution is decreased. Therefore, the etching rate with the ion beam at the central portion in the plane of the substrate 111 is caused to be higher than that in the outer peripheral portion in the plane of the substrate 111, so that the etching is done while correcting the film thickness distribution in the plane of the substrate 111 caused by the CMP step.

In normal cases, in order to obtain a uniform plasma density distribution in the direction of the plane of the substrate 111 within the plasma generation chamber 102, the current applied to the inner coil 106a and the electric current applied to the outer coil 106b are caused to be the same. In contrast, in the present embodiment, in order to increase the etching rate in the central portion, the current value of the outer coil 106b is caused to be higher than the current value of the inner coil 106a.

Figure 4:
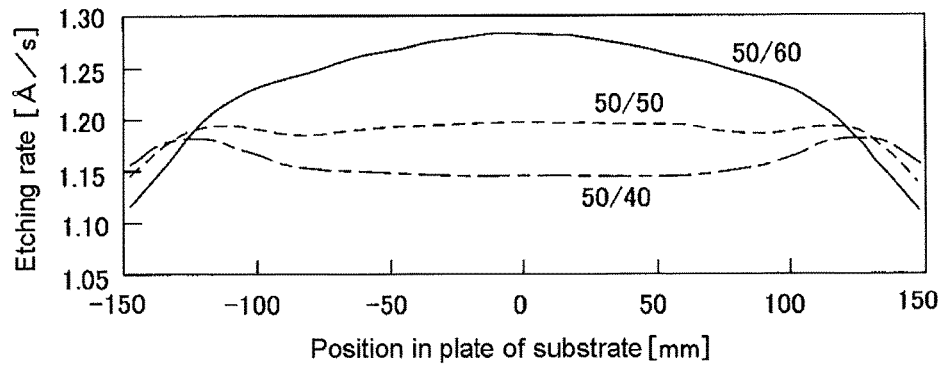
FIG. 4 is a figure illustrating a difference of an etching rate depending on a position in a substrate plane when electric current values of an outer coil and an inner coil provided in a plasma generation chamber of the ion beam etching device according to the present disclosure.

FIG. 4 shows a difference in the etching rate at each point of the substrate 111 when the currents applied to the inner coil 106a and the outer coil 106b are varied. $SiO_2$ is used as an etching object. In FIG. 4, the vertical axis denotes an etching rate, and the horizontal axis denotes a distance from the central portion in the radius direction where the central portion in the plane of the substrate 111 is defined as zero. It should be noted that the numerical values indicated on a line connecting each plot represent current values applied to the inner coil 106a and the outer coil 106b. The left side of the numerical values denotes a current applied to the inner coil 106a, and the right side of the numerical values denotes a current applied to the outer coil 106b. As can be understood from FIG. 4, in a case where the current values applied to the inner coil 106a and the outer coil 106b are equal (50/50), the etching rates of the central portion of the substrate 111 and the outer peripheral portion of the substrate 111 are substantially the same, but in a case where the current applied to the outer coil 106b is increased (50/60), the etching rate in the central portion of the substrate 111 increases.

It should be noted that the other conditions at this case are as follows. Ar gas is used as the etching gas. The flow rate of Ar gas flowing in the plasma generation chamber 2 is 20 sccm. The voltage applied to the first electrode 115 is configured to be 200 V, and the current flowing in the first electrode 115 is configured to be 400 mA. The ion beam drawn from the grid 109 is configured to be vertically incident upon the surface of the sample. At the same time as emission of the ion beam, electrons are discharged from the neutralizer to the substrate 111. The neutralizer generates plasma using a hollow cathode-type cathode, and electrons are drawn using the potential difference from the anode.

Figure 5:
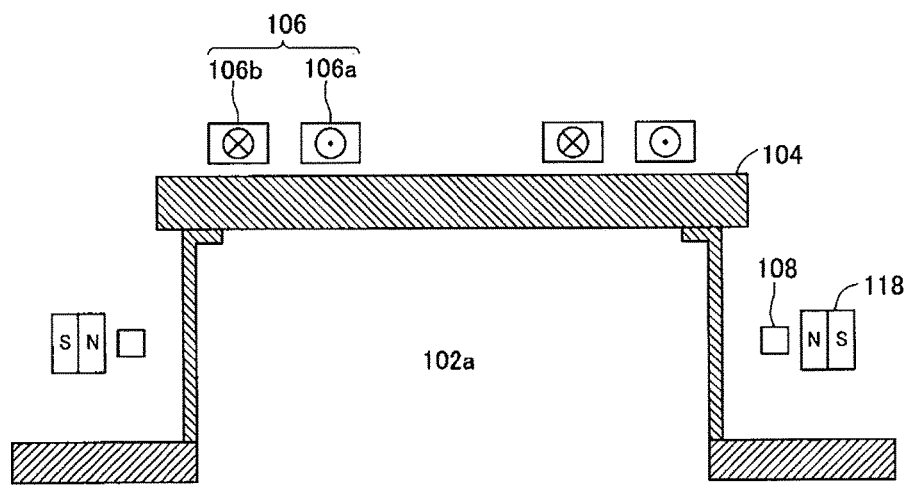
FIG. 5 is a cross sectional schematic view illustrating magnetic poles of a permanent magnet and a direction of an electric current applied to electromagnetic coils provided in the plasma generation chamber of the ion beam etching device according to the present disclosure.

The directions of the currents applied to the inner coil 106a and the outer coil 106b will be explained with reference to FIG. 5. The inner coil 106a generates a magnetic field in the direction opposite to the direction from the plasma generation chamber 102 to the substrate 111 at the center of the plasma generation chamber 102, and the outer coil generates a magnetic field in the same direction as the direction from the plasma generation chamber 102 to the substrate 111. The permanent magnet 118 is disposed such that the side of the plasma generation chamber 102 is an N-pole.

After discharge is started in the plasma generation chamber 102, plasma density distribution is formed in the plasma generation chamber 102, whereby ion beam is drawn and emitted to the substrate 111 as described above. In this IBE step, the film on the substrate 111 processed by the CMP step is etched by a thickness of several nm to several dozen nm, so that the film thickness distribution in the plane of the substrate 111 can be corrected, and as a result, this can reduce variation of Vt of the FET formed on the substrate 111.

Second Embodiment

In the first embodiment, the film thickness distribution in the substrate plane processed by the CMP step is corrected by adjusting the plasma density in the plasma generation chamber 102. In contrast, in the present embodiment, the aperture ratio of the ion passage holes of the grid 109 is varied in the plane of the grid, so that the film thickness distribution in the substrate plane is corrected.

The larger the number of ion passage holes are formed in the grid 109, or the larger the diameter of the ion passage hole is, the more ion beams are drawn. Therefore, at the position facing the central portion of the substrate 111, the aperture ratio of the ion passage holes of the grid 109 is increased, and at the position facing the outer peripheral portion in the plane of the substrate 111, the aperture ratio of the ion passage holes of the grid 109 is decreased, so that the etching rates at the central portion and the outer peripheral portion in the plane of the substrate 111 can be differentiated.

In the present disclosure, the ion passage hole of the grid 109 means an ion passage hole of the grid 109 which is an electrode assembly including the first electrode 115, the second electrode 116, and the third electrode 117. For example, the following case will be explained: the ion passage holes of the first electrode 115 and the second electrode 116 are formed with the same diameter and at the same position, and the ion passage hole of the third electrode 117 is formed at the same position, but the diameter thereof is less than that of the other electrodes. At this case, the ion passage hole of the grid 109 is substantially defined by the ion passage hole of the third electrode 117. On the contrary, when the ion passage holes of the second electrode 116 and the third electrode 117 are formed with the same diameter and at the same position, and the ion passage hole of the first electrode 115 is formed at the same position, but the diameter is less than that of the other electrodes, the ion passage hole of the grid 109 is substantially defined by the ion passage hole of the first electrode 115.

The aperture ratio of the ion passage hole means the ratio of the area of the ion passage hole with respect to the electrode portion at each point of the grid 109. An example where the aperture ratio of the ion passage hole is higher in the central portion than in the peripheral portion is as follows. In the first example, the diameters of the ion passage holes in the central portion and the outer peripheral portion are the same, and in the central portion and the outer peripheral portion, the number of ion passage holes per unit area is larger in the central portion. In the second example, the numbers of ion passage holes per unit area in the central portion and the outer peripheral portion are the same, and in the central portion and the outer peripheral portion, the diameter of the ion passage hole is larger in the central portion. In the third example, both of these conditions are satisfied. Usually, the ion passage hole is in a circular shape, and therefore, the area is indicated by the diameter, but in the present disclosure, the ion passage hole is not limited to a circular shape.

The film thickness distribution in the substrate plane processed by the CMP step has a certain level of reproducibility, and therefore, like the present embodiment, the ion passage hole of the grid 109 can be adjusted so as to correct the film thickness distribution.

Figure 6:
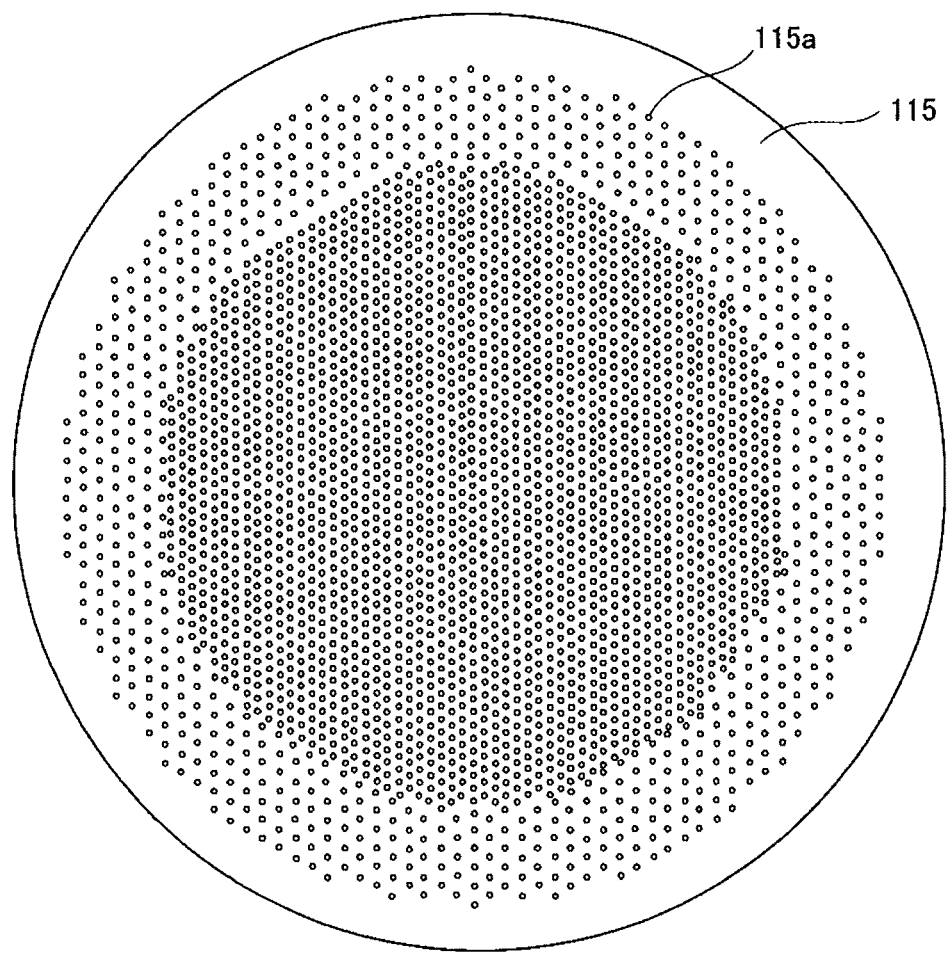
FIG. 6 is a schematic top view illustrating an electrode used in a grid of a second embodiment of the present invention.

FIG. 6 shows an example of configuration of the grid 109 according to the present embodiment. FIG. 6 shows ion passage holes formed in the first electrode 115 and the first electrode 115. In the second electrode 116 and the third electrode 117, the same ion passage holes are formed in the same manner, and the first electrode 115 to the third electrode 117 are assembled so that the ion passage holes overlap at each point. On the first electrode 115 as shown in FIG. 6, the numbers of ion passage holes 115a are different in the central portion and the outer peripheral portion. More specifically, the diameters of the ion passage holes 115a are the same, but the interval with which the ion passage holes 115a are formed is 1.5 times larger in the outer peripheral portion than in the central portion.

The embodiment is not limited to such aspect as shown in FIG. 6. For example, the aperture ratio of the ion passage holes may be varied in a stepwise manner from the central portion to the outer peripheral portion of the grid 109.

Third Embodiment

In the second embodiment explained above, the aperture ratio of the ion passage holes of the grid 109 is varied in the plane of the grid, whereby the film thickness distribution in the plane of the substrate 111 is corrected. The present embodiment is also the same as the second embodiment in that the aperture ratio of the ion passage holes of the grid 109 is varied in the plane of the grid 109, and in addition, the main point of the present embodiment is that a mechanism for changing the aperture ratio of the ion passage holes of the grid 109 is provided.

Figure 7:
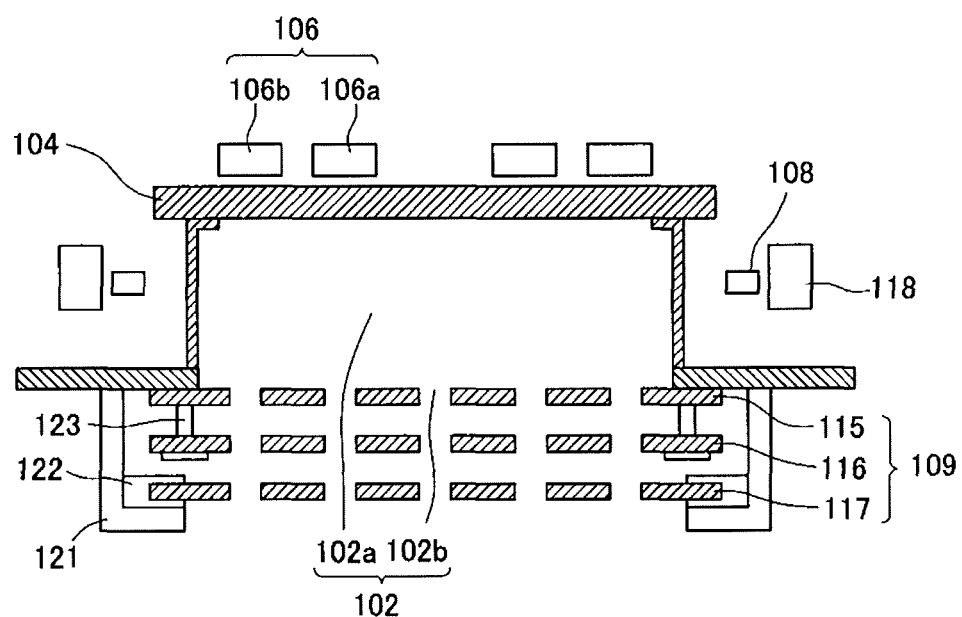
FIG. 7 is a cross sectional schematic view illustrating a configuration of a grid of an ion beam etching device according to a third embodiment of the present invention.

FIG. 7 is a figure for explaining an IBE device according to the present embodiment. In order to explain the gist of the present embodiment, FIG. 7 enlarges and shows the vicinity of the plasma generation chamber 102, and in FIG. 7, description about some of the same elements as those explained in the above embodiments is omitted.

The fixing member 123 connects the first electrode 115 and the second electrode 116, and fixes them to the inner wall of the treatment chamber 101. The support member 121 supports the third electrode 117 independently from the first electrode 115 and the second electrode 116. The rotation driving unit 122 is a device for rotating the third electrode 117 in the plane, and is provided on the support member 121. An example of a mechanism for rotating the third electrode 117 is such that a saw-shaped groove is formed on the outer periphery of the third electrode 117, and it is engaged with the gear of the rotation driving unit 122, and the gear is configured to be rotatable by the motor of the rotation driving unit 122.

When the third electrode 117 is rotated in the circumferential direction in the plane, the deviation of the positions of the first electrode 115 and the second electrode 116 from the ion passage holes is not large in the central portion, but the deviation increases toward the outer peripheral portion. More specifically, toward the outer peripheral portion, the aperture ratio of the ion passage holes of the grid 109 decreases. Therefore, the ion beam drawn from the grid 109 increases at the position facing the central portion in the plane of the substrate 111 than at the position facing the outer peripheral portion in the plane of the substrate 111, and the etching rate increases in the central portion than in the outer peripheral portion in the plane of the substrate 111.

According to the present embodiment, the third electrode 117 is rotated according to desired process, so that the ratio of the etching rates in the outer peripheral portion and the central portion in the plane of the substrate 111 can be varied appropriately. According to the control in response to film thickness measurement result as a result of the CMP step explained later, more uniform processing can be done. It should be noted that the rotated electrode is preferably the third electrode 117 from the perspective of the film thickness distribution and ion beam characteristics in the plane of the substrate 111 after the IBE step, but the film thickness distribution in the plane of the substrate 111 can be corrected also by rotating the first electrode 115 and the second electrode 116.

Fourth Embodiment

The gist of the present disclosure lies in correction of the film thickness distribution in the plane of the substrate 111 existing after the CMP step by using the IBE step, but in the IBE, the etching rate is different according to an object substance. As described above, in the process of manufacturing the FET shown in FIGS. 3A to 3C, the gate insulating film 210 is etched by performing the IBE step after the processing is done with the CMP step until the gate insulating film 210 is exposed, but at this case, a film of which constituent material is made of a Si-based compound such as the gate insulating film 210 made of $SiO_2$ and the CMP stopper film 206 made of SiN has an etching rate higher than the diffusion preventing film 211 made of a Ti-based compound such as TiN. For this reason, the diffusion preventing film 211 in the trench (200 in FIG. 3A) after the IBE step may protrude more greatly than the gate insulating film 210 and the CMP stopper film 206. Such a conductive protrusion may cause a problem such as contact with an adjacent contact plug when there is a position deviation of a contact plug formation point when, for example, a cap film made of SiN is thereafter deposited, and the contact plug for a high melting point metal silicide film is formed.

Figure 8:
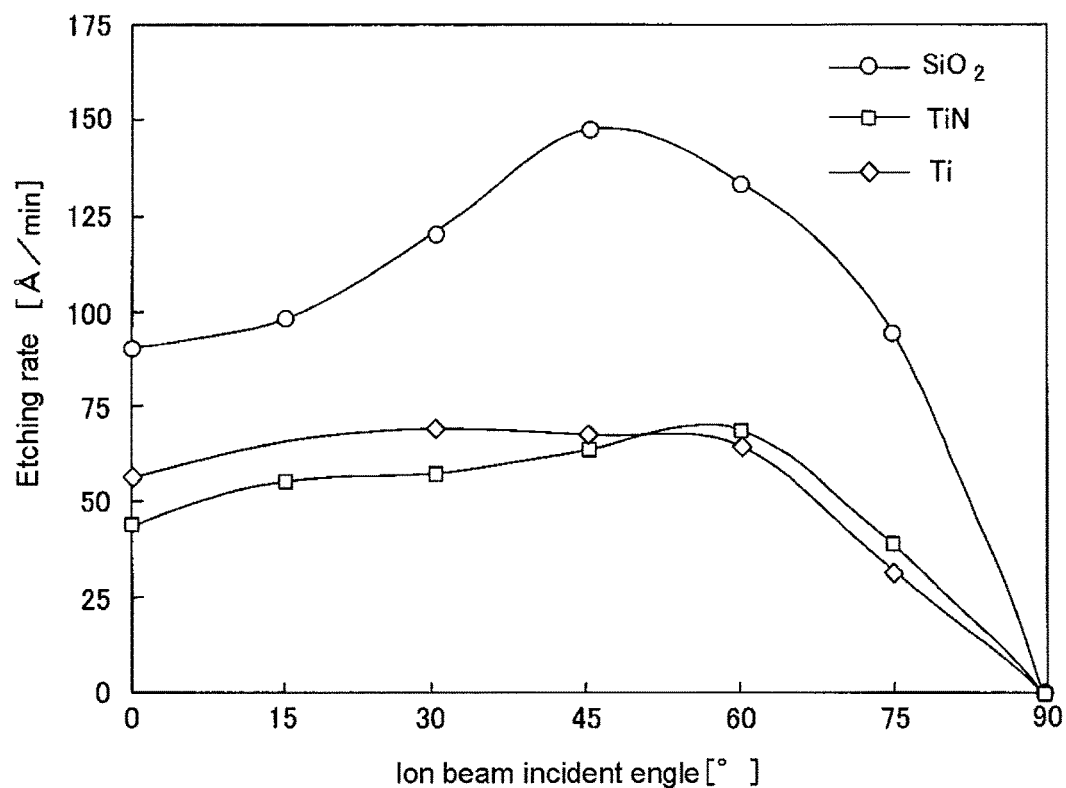
FIG. 8 is a figure illustrating a relationship of an ion beam incidence angle and an etching rate according to a fourth embodiment of the present invention.

FIG. 8 shows a relationship between the etching rate and the ion beam incidence angle in the IBE step of each substance. It should be noted that the incidence angle is defined as zero degrees when the ion beam is incident upon a material to be etched in the vertical direction. For example, at the incidence angle of 45 degrees, the etching rate of $SiO_2$ is about 145 Å/min, but the etching rate of TiN is about 60 Å/min.

Therefore, when the IBE step is performed, $SiO_2$ which is the gate insulating film 210 is likely to be etched. In particular, in the IBE step, the ion beam is preferably incident upon the substrate 111 with a certain inclination in order to correct not only the film thickness distribution but also the surface roughness in the plane of the substrate 111 generated in the CMP step. However, according to FIG. 8, at an angle of 45 degrees or more which is preferable for planarization, the difference in the etching rates of $SiO_2$ and TiN also increases.

It is an object of the present embodiment to reduce the difference of the etching rate of Ti-based metal and the gate insulating film 210, and to improve the flexibility in correcting the film thickness distribution in the plane of the substrate 111 generated in the CMP step.

In any of the above embodiments, discharge is generated by introducing inactive gas into the plasma generation chamber 102, and the ion of the inactive gas is drawn. In contrast, in the present embodiment, not only the inactive gas but also chlorine ($Cl_2$) including gas is introduced into the plasma generation chamber 102. Of $SiO_2$ and TiN, TiN has a higher reactivity with $Cl_2$ gas, and therefore, by using mixed gas including the inactive gas and $Cl_2$ gas, the ion beam including the chlorine ion is emitted onto the substrate 111, so that the etching rate of TiN can be improved, and the diffusion preventing film 211 can be prevented from protruding in the trench.

In a case where the diffusion preventing film 211 made of TiN is not provided, and in a case where a material capable of selectively etching $SiO_2$ is used for the diffusion preventing film 211, the IBE step may be performed by using mixed gas of Ar and $O_2$ or mixed gas of Ar and $N_2$ in order to obtain etching selectivity of $SiO_2$ and the conductive film 212.

Subsequently, a control device used to execute an embodiment according to the present invention will be explained with reference to FIG. 9.

A control device 301 for operating an IBE device according to the present disclosure includes a main control unit (not shown) and a storage device (not shown), and stores control programs for executing various kinds of substrate treatment processes according to the present disclosure. For example, the control programs are implemented as a mask ROM. Alternatively, the control programs can be installed to a storage device constituted by a hard disk drive (HDD) and the like via an outer recording medium and a network.

The main control unit of the control device 301 is electrically connected to each of power supplies 302, 303 connected to the inner coil 106a and the outer coil 106b, a power supply 304 applying electric power for discharge, power supplies 305, 306 connected to the first electrode 115 and the second electrode 116, driving mechanisms 307, 308, 309 of the substrate holder 110, the exhaust means, and the gas introduction system, and a gate valve 310, and the like. As described above, by connecting each element of the IBE device according to the present disclosure, the operation of the IBE device is configured to be able to be managed and controlled.

Fifth Embodiment

Figure 10A:
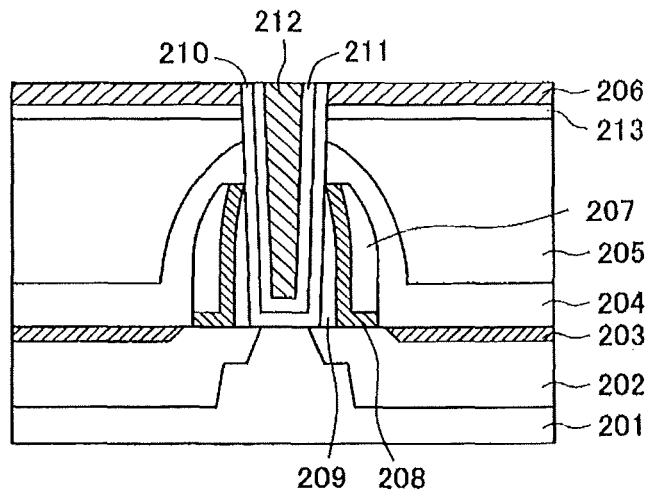
FIGS. 10A, 10B, and 10C are a cross sectional schematic views for explaining a portion of a process of manufacturing a field effect transistor having a gate last structure according to a fifth embodiment of the present invention.

The present embodiment will be explained with reference to FIGS. 10A to 10C. In the present embodiment, a hard mask 213 is inserted under the CMP stopper film 206 as shown in FIG. 10A in the process of manufacturing the FET as shown in FIGS. 3A to 3C.

As explained in the fourth embodiment, when the film thickness distribution of the gate insulating film 210 in the plane of the substrate 111 is corrected in the IBE step after the CMP step, the etching rate of the ion beam is greatly different in the diffusion preventing film 211 made of TiN formed in the trench and a Si-based compound outside thereof, e.g., the gate insulating film 210 made of SiO$_2$ and the CMP stopper film 206 made of SiN, and therefore, the diffusion preventing film 211 may protrude after the IBE step.

Therefore, in the present embodiment, a hard mask 213 made of a material of which etching rate is lower than the Ti-based compound is provided as the under layer of the CMP stopper film 206. The hard mask 213 is made of, for example, Al$_2$O$_3$, carbon film, and the like, and a material of which etching rate during emission of the ion beam is lower than the Ti-based compound is used.

Figure 10B:
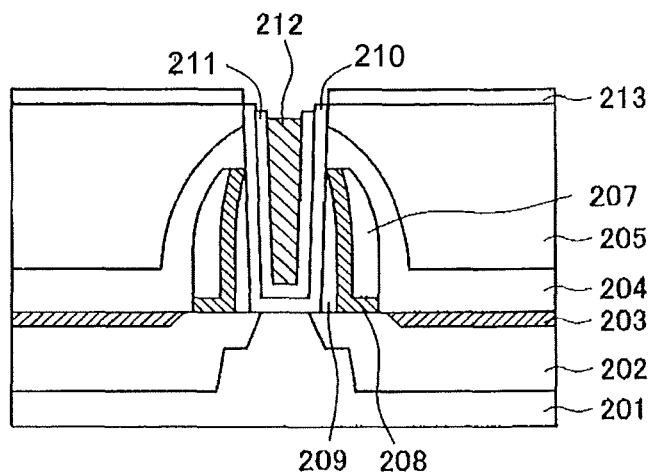
Figure 10C:
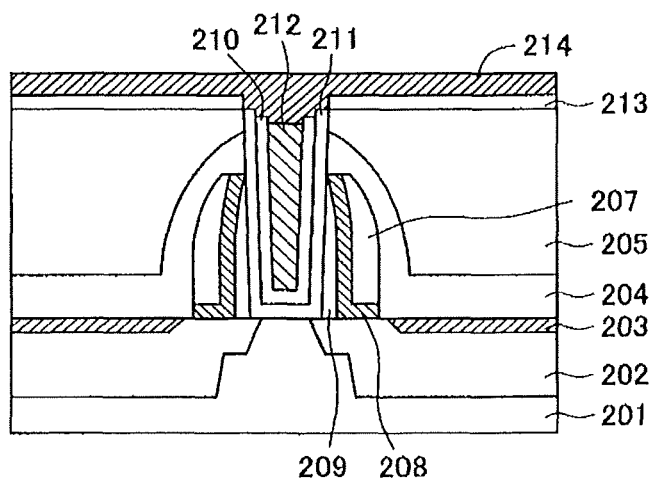

In the present embodiment, when the hard mask 213 is exposed by removing the CMP stopper film 206 in the IBE step by providing the hard mask 213, the diffusion preventing film 211 made of TiN left in the trench is selectively etched, and as shown in FIG. 10B, it is prevented from protruding more greatly than the adjacent insulating film 205 in the trench and the gate insulating film 210. Therefore, even when the cap film 214 made of SiN is deposited, the diffusion preventing film 211 does not protrude, and a flat surface is obtained as shown in FIG. 10C, and it is possible to avoid a problem of, e.g., contact between adjacent contact plugs explained above.

The hard mask 213 is preferably made of an insulating material in order to maintain insulation between contact plugs, but the hard mask 213 may be made of a conductive film such as a carbon film, and may be removed when the film thickness distribution is corrected in the IBE step or after the correction.

Further, the IBE step may be done by using mixed gas of Ar and O$_2$ or mixed gas of Ar and N$_2$ in order to obtain etching selectivity of the gate insulating film 210 and the conductive film 212.

Sixth Embodiment

The present embodiment is characterized in that the film thickness distribution in the substrate plane is measured after the CMP step, and the intensity of the film thickness distribution correction is adjusted in the IBE step subsequent thereto. More specifically, the present embodiment is based on the first embodiment, the third embodiment, or the fourth embodiment, and is characterized in that the film thickness distribution of the gate insulating film 210 is measured after the CMP step, and in accordance with the measurement result, the IBE step is controlled.

Figure 11:
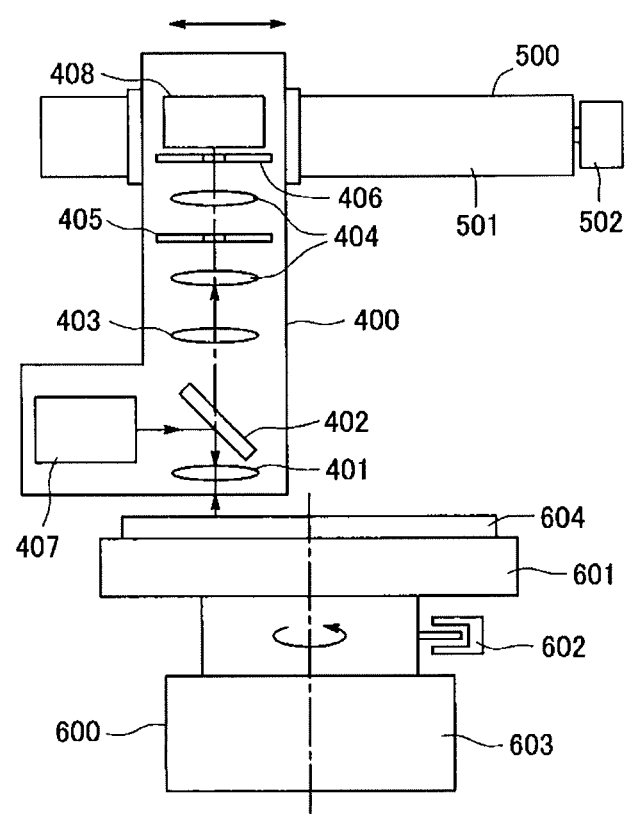
FIG. 11 is a cross sectional schematic view illustrating a configuration of a film thickness measurement device used for the present disclosure.

In the film thickness measurement after the CMP step, the film thickness of the gate insulating film 210 is measured using an optical measurement device as shown in FIG. 11. The film thickness measurement device includes a detection optical system 400, an optical system moving unit 500, a stage unit 600, and a film thickness measurement processing unit (not shown).

The stage unit 600 includes a rotation stage 601 on which the substrate 604 is placed, a photoelectric sensor 602 for detecting passage of a particular position of the rotation stage 601, and a driving motor 603 for rotating the rotation stage 601. A detection optical system 400 for detecting the spectral waveform of the surface of the substrate 604 processed by the CMP step includes an object lens 401, a half mirror 402, an image formation lens 403, a relay lens 404, a space filter 405, a field stop 406, an illumination light source 407, and a spectroscope 408.

The illumination light source 407 uses a white color illumination light source such as a xenon lamp or a halogen lamp to emit white color illumination light via the half mirror 402 and the object lens 401 to the substrate 604. The reflected light from the substrate 604 is guided to the spectroscope 408 via the object lens 401, the half mirror 402, the image formation lens 403, the relay lens 404, the space filter 405, and the field stop 406.

A spectral waveform diffracted by the spectroscope 408 is input, as an electric signal, into a film thickness measurement processing unit, not shown, and the film thickness is calculated, so that the film thickness distribution in the plane of the substrate 604 is derived. The optical system moving unit 500 includes an optical system moving guide 501 and a driving motor 502, and detects the spectral waveform on the entire surface of the substrate 604 by moving the detection optical system 400 in the radius direction of the rotation stage 601. A frequency/phase analysis processing unit in the film thickness measurement processing unit converts the horizontal axis of the spectral waveform of which waveform has been corrected into a reciprocal number of the wavelength, and performs frequency/phase analysis of the spectral waveform. On the basis of the analysis result, the film thickness calculation is performed.

Figure 9:
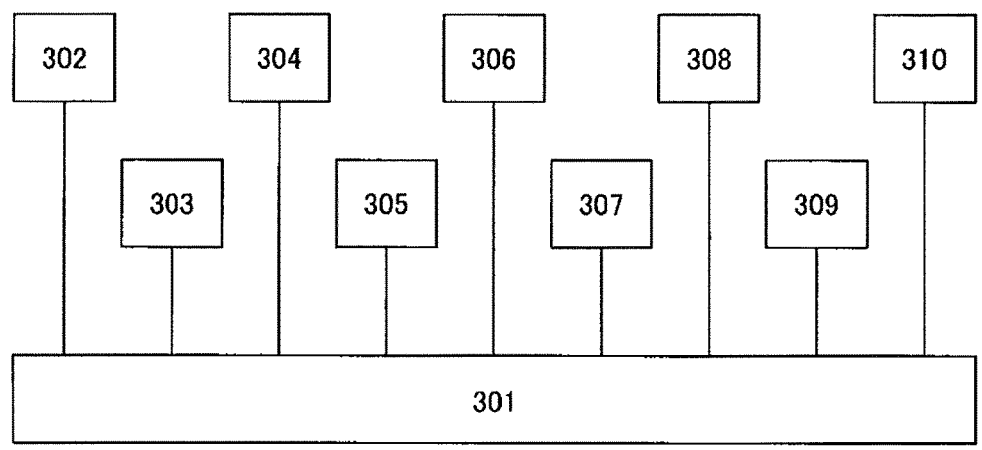
FIG. 9 is an explanatory diagram illustrating a control device used for the present disclosure.

According to the film thickness measurement device explained above, the film thickness distribution in the substrate plane processed by the CMP step is derived, and the measurement result is input into the control device 301 of FIG. 9, and in accordance with the measurement result, the IBE step is controlled, so that the film thickness distribution in the substrate plane can be corrected with a high degree of accuracy.

Parameters in the IBE step for control according to the measurement result include aspects shown below.

In the first embodiment, the parameters are the current values applied to the outer coil 106b and the inner coil 106a. In the third embodiment, the parameter is the amount of rotation in the plane of the electrode plate of the third electrode 117. In the fourth embodiment, the parameter is the amount of introduced Cl$_2$ gas. In each of the embodiments, the voltage applied to each electrode constituting the grid 109 may be controlled.

As explained above, in the case of the above embodiment, all of the film thickness distributions in the substrate plane processed by the CMP step are such that the film thickness in the central portion in the substrate plane is thicker than in the outer peripheral portion. The present disclosure is not limited thereto, and can be applied to a case where the film thickness in the central portion in the substrate plane is thinner than in the outer peripheral portion. For example, this is a case where polishing is performed while the pad pressure in the central portion is increased in the CMP step, or a case where the entire substrate is polished after only the central portion is polished in advance.

In such cases, the IBE step is performed so that the etching rate in the outer peripheral portion in the plane of the substrate 111 becomes higher than the central portion in the plane of the substrate 111. In the first embodiment explained above, this can be achieved by making the plasma density in the plasma generation chamber 102 at the position facing the outer peripheral portion in the plane of the substrate 111 to be higher than at the position facing the central portion in the plane of the substrate 111. In the second embodiment, this can be achieved by making the aperture ratio of the ion passage hole of the grid 109 at the position facing the outer peripheral portion in the plane of the substrate 111 to be higher than at the position facing the central portion in the plane of the substrate 111.

As explained above, the embodiment of the present disclosure has been explained using an example of a case where a film thickness distribution occurs in the gate insulating film by the CMP step in the manufacturing of the FET having the gate last structure, but the present invention is not limited to such embodiment, and can be preferably applied to any method for manufacturing a semiconductor device as long as a film thickness distribution occurs due to the CMP step.

EXPLANATION OF NUMERALS

101: ion beam generation device
101: treatment chamber
102: plasma generation chamber
102a: internal space of plasma generation chamber
102b: opening of plasma generation chamber
103: exhaust means
104: bell jar
105: gas introduction unit
106: electromagnetic coil
106a: inner coil
106b: outer coil
107: matching device
108: RF antenna
109: grid
110: substrate holder
111: substrate
112: ESC electrode
115: first electrode
115a: ion passage hole
116: second electrode
117: third electrode
118: permanent magnet
120: fixing member
121: support member
122: rotation driving unit
123: fixing member
200: trench
201: n-type well
202: p-type source region or p-type drain region
203: high melting point metal silicide film
204: stress liner film
205: insulating film
206: CMP stopper film
207: SiN film
208: SiO$_2$ film
209: SiN film
210: gate insulating film
211: diffusion preventing film
212: conductive film
213: hard mask
214: cap film
301: control device
302: power supply connected to outer coil
303: power supply connected to inner coil
304: power supply for discharge
305: power supply connected to first electrode
306: power supply connected to second electrode
307: driving mechanism of substrate holder
308: exhaust means
309: gas introduction system
310: gate valve
400: detection optical system
401: object lens
402: half mirror
403: image formation lens
404: relay lens
405: space filter
406: field stop
407: illumination light source
408: spectroscope
500: optical system moving unit
501: optical system moving guide
502: driving motor
600: stage unit
601: rotation stage
602: photoelectric sensor
603: driving motor
604: substrate

The invention claimed is:

1. An ion beam etching device comprising:
a plasma generation chamber;
a treatment chamber configured to process a substrate;
a grid provided between the treatment chamber and the plasma generation chamber, and for forming an ion beam by drawing ions from the plasma generation chamber;
a gas introduction unit for introducing discharge gas into the plasma generation chamber;
an exhaust for exhausting the treatment chamber;
a substrate holder in which a substrate provided is placed in the treatment chamber;
a control unit configured to receive a measurement result of an in-plane film thickness distribution before the substrate is processed; and
an electromagnetic coil provided outside of the plasma generation chamber and provided in a ceiling portion opposite to the grid of the plasma generation chamber, wherein
the electromagnetic coil includes an outer coil provided on an outer circumference of the ceiling portion and an inner coil provided on an inner circumference of the ceiling portion, current values applied to the outer coil and the inner coil can be independently controlled, and
the control unit controls the currents applied to the outer coil and the inner coil in accordance with the measurement result received by the control unit.

2. The ion beam etching device according to claim 1, wherein
the inner coil generates a magnetic field in a first direction opposite to a second direction from the plasma generation chamber to the substrate, and
the outer coil generates a magnetic field in the same direction as the second direction from the plasma generation chamber to the substrate, at the center of the plasma generation chamber.

3. A control device used for the ion bean etching device according to claim 1, wherein
the measurement result of an in-plane film thickness distribution of the substrate is input, and
each of current values of the outer coil and the inner coil is controlled on the basis of the measurement result.

* * * * *